United States Patent [19]

Kung et al.

[11] 4,267,466

[45] May 12, 1981

[54] SIGNAL GENERATOR HAVING MINIMUM DELAY

[75] Inventors: Roger I. Kung; Jerry D. Moench, both of Austin, Tex.

[73] Assignee: Motorola, Inc., Schaumburg, Ill.

[21] Appl. No.: 17,746

[22] Filed: Mar. 5, 1979

[51] Int. Cl.³ .............................................. H03K 3/26
[52] U.S. Cl. ............................... 307/279; 307/DIG. 3
[58] Field of Search .......................... 307/279, DIG. 3

[56] References Cited

U.S. PATENT DOCUMENTS

| | | | |
|---|---|---|---|
| 3,363,115 | 1/1968 | Stephenson et al. | 307/279 |
| 3,518,635 | 6/1970 | Cole | 307/DIG. 3 |
| 4,070,590 | 1/1978 | Ieda et al. | 307/DIG. 3 |
| 4,146,802 | 3/1979 | Moench | 307/279 |

Primary Examiner—Harold A. Dixon
Attorney, Agent, or Firm—Joe E. Barbee

[57] ABSTRACT

A signal generating circuit is provided which provides an output signal in response to an input signal. The output signal has minimum delay with respect to the input signal. The signal generating circuit has an inverter to receive the input signal. A cross coupled latch is coupled to the inverter and provides the output signal. A DC load stage is used as a load for the cross coupled latch. A transistor is coupled to the output signal to pull the output signal low upon command. Control circuitry is coupled to the transistor and helps precondition the signal generating circuitry so that it can respond to the input signal with minimum delay.

9 Claims, 2 Drawing Figures

SIGNAL GENERATOR HAVING MINIMUM DELAY

The present invention relates, in general to signal generating circuits, and more particularly, to those signal generating circuits which generate an output signal as a result of an input signal.

In the field of integrated semiconductor memories it is desirable to be able to control reading data out of the memory upon command of a single input signal to the memory and to terminate the reading of data out upon command. The termination must be done with minimum delay from the time the memory receives the command. In this manner the microprocessor or computer coupled to the memory can precisely control reading out data from the memory. It is customary for the memory to receive the control signal and to generate its own output disable signal which disables output drivers of the memory thereby making the output drivers go to a high output impedance state. The circuitry used to generate the output disable signal usually includes a latch circuit. The signal generating circuit must be designed in a manner to minimize the delay in generating the output disable signal.

Accordingly, it is an object of the present invention to provide an improved signal generating circuit which can respond to an external signal and produce an output with minimum delay.

SUMMARY OF THE INVENTION

In carrying out the above and other objects of the invention in one form, there is provided a signal generating circuit which can generate a signal from an input signal with minimum delay. The generating circuit includes an inverter for receiving the input signal and a cross coupled latch coupled to the inverter. The output of the cross coupled latch provides the generated signal. A load stage is coupled to the output of the latch to provide means for pulling the output high. A controllable means provides a signal which is used to control a transistor coupled to the output of the latch which can, upon command, pull the output low, and also controls a transistor coupled to the input of the latch which, upon command, can pull the input of the latch high.

The subject matter which is regarded as the invention is set forth in the appended claims. The invention itself, however, together with further objects and advantages thereof, may be better understood by referring to the following detailed description taken in conjunction with the accompanying drawings.

DETAILED DESCRIPTION OF THE DRAWINGS

Figure 1:
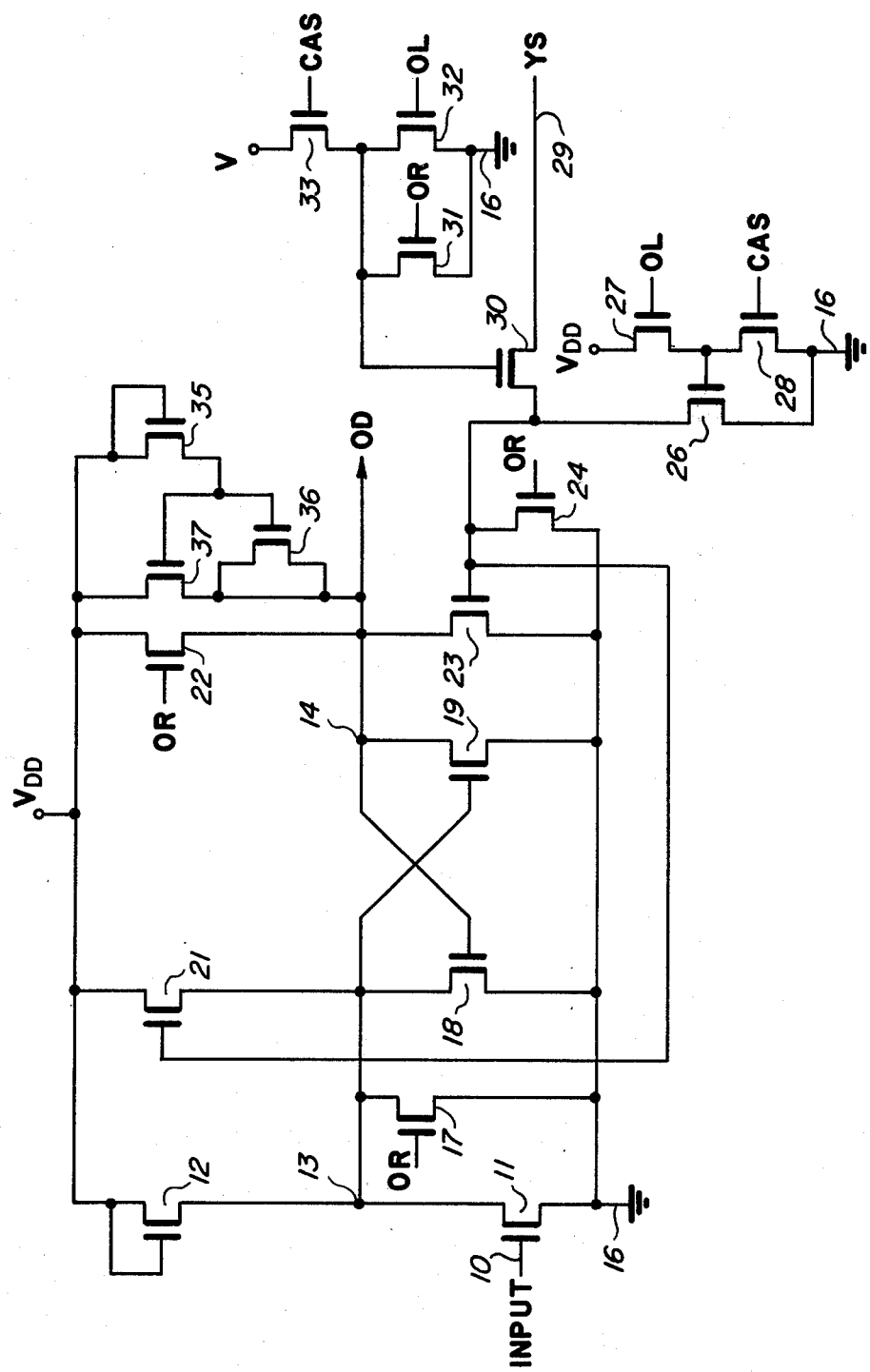
FIG. 1 is a schematic diagram of an embodiment of the present invention.

FIG. 1 illustrates a signal generating circuit which can generate an output disable signal OD from an input signal. The input signal is coupled to line 10 which serves as a gate electrode for transistor 11. Transistor 11 is in series with transistor 12 between a voltage terminal $V_{DD}$ and a reference terminal 16, illustrated as ground. Transistor 12 has its gate electrode connected to its drain electrode. A node 13 formed between transistors 11 and 12 serves as an output node for an inverter formed by transistors 11 and 12 and also serves as an input node for a cross coupled latch having transistors 18 and 19. Transistor 18 is coupled between node 13 and ground and has its gate electrode coupled to node 14, which serves as an output node for the cross coupled latch. Transistor 19 is coupled between node 14 and ground and has its gate electrode coupled to input node 13. Transistor 17 is coupled between node 13 and ground and has its gate electrode coupled to an overriding signal OR. A transistor 21 is coupled between voltage terminal $V_{DD}$ and node 13. A transistor 22 is coupled between voltage terminal $V_{DD}$ and output node 14, and has its gate electrode coupled to the overriding signal OR.

A dc load stage is coupled from voltage terminal $V_{DD}$ to output node 14. The dc load stage has three transistors 35, 36, and 37. Transistor 37 is coupled between voltage terminal $V_{DD}$ and node 14. Transistor 36 has its drain and source electrodes coupled to output node 14 and has its gate electrode coupled to the gate electrode of transistor 37. Transistor 36 is connected in a manner so that transistor 36 serves as a capacitor. Transistor 35 is coupled between voltage terminal $V_{DD}$ and the gate electrodes of transistors 36 and 37. Transistor 35 has its gate electrode coupled to voltage terminal $V_{DD}$ and therefore functions as a diode. Transistors 35, 36 and 37 serve to pull output node 14 to a voltage high level when no other transistor is pulling output node 14 to a low level.

A transistor 23 is coupled from output node 14 to ground and has its gate electrode coupled to the gate electrode of transistor 21. A transistor 24 is coupled from the gate electrode of transistor 23 to ground. Transistor 24 has its gate electrode coupled to the overriding signal OR. A transistor 30 is coupled from the gate electrode of transistor 23 to line 29. A column decoder enable signal YS is coupled to line 29. Transistor 30 has its gate electrode coupled to a drain electrode of transistor 31. Transistor 31 has its source electrode connected to ground and its gate electrode connected to overriding signal OR. Transistor 32 is in parallel with transistor 31 and has its gate electrode coupled to an output latch timing signal OL. A transistor 33 is coupled from voltage terminal $V_{DD}$ to the drain electrode of transistor 32. Transistor 33 has its gate electrode coupled to a column address strobe timing signal CAS. A transistor 26 is in parallel with transistor 24 and has its gate electrode coupled to a drain electrode of transistor 28. Transistor 28 has its source electrode coupled to ground. The gate electrode of transistor 28 is coupled to timing signal CAS. Coupled between the drain electrode of transistor 28 and voltage terminal $V_{DD}$ is transistor 27. Transistor 27 has its gate electrode connected to timing signal OL.

When the input signal on line 10 goes high, transistor 11 is enabled thereby driving node 13 low. With node 13 low, transistor 19 will be non-conducting and therefore node 14 will not be pulled to ground provided transistor 23 is not pulling node 14 to ground. With no active pulldown on node 14 the dc load stage will pull output OD to a high voltage level. The circuit of FIG. 1 is useful in generating output signal OD from an input signal applied to line 10. This circuit has particular application in a random access memory (RAM) system. The input signal applied to line 10 is an externally supplied signal. The output disable signal OD is used to control or disable output drivers of a circuit which provides output data from the memory system itself. As a result, it is desirable that output disabling signal OD track the input signal applied to line 10 as close as possible. One of the problems of the prior art circuit was that the output disable signal had a long turn on delay with respect to the input signal. A typical prior art circuit had an inverter coupled to a cross coupled latch which had diode connected transistors as load devices for the latch. Coupled to the output of the latch was a controllable pull-up transistor and a controllable pull-down transistor. The problem was that the pull-down device did not come into operation soon enough. To overcome this problem the control circuitry coupled to the gate electrode of transistor 23 is provided which serves to precondition the circuitry of FIG. 1 so that it can respond, with minimum delay, to the input signal.

In a typical random access memory system some precharging and/or refreshing of memory cells must be done. During the precharging period, the input signal coupled to line 10 and the timing signal CAS are at a high level. As a result transistor 11 will be enabled thereby driving node 13 low which turns transistor 19 off. At the same time transistors 28 and 33 are enabled which places a low level at the gate electrode of transistor 26 and a high level at the gate electrode of transistor 30. The high on the gate electrode of transistor 30 will enable transistor 30, thereby coupling signal YS to the gate electrode of transistor 23. However, during precharging, timing signals YS and OL are at a low level, and therefore, transistor 23 will not be enabled, and output node 14 will be allowed to go to a high level by the action of transistors 35, 36, and 37. A short time after the input signal connected to line 10 goes low, timing signal CAS will go low. Thereafter timing signal YS will go to a high level, and since the gate electrode of transistor 30 was previously charged to a high level, transistor 30 will conduct thereby coupling the high level signal, YS, to the gate electrode of transistor 23 and to the gate electrode of transistor 21. This causes output node 14 to be pulled low and input node 13 to be pulled high by the action of transistor 12 and transistor 21. Shortly after signal YS goes high, timing signal OL will go high thereby enabling transistor 32 which places a low level on transistor 30 causing it to become nonconductive. Output latch signal OL on the gate electrode of transistor 27 will cause transistor 27 to conduct thereby placing a high voltage level on the gate electrode of transistor 26 making transistor 26 conduct which removes or shunts the enabling signal from the gate electrode of transistors 21 and 23. This leaves output node 14 in a low state and node 13 in a high state. As soon as the input signal on line 10 goes high again, node 13 will go low making transistor 19 non-conductive allowing node 14 to rise once again.

The purpose of transistors 17, 22, 24, and 31 is to have an override capability for the signal generating circuit. When control signal OR, which is not dependent, time-wise, on the other signals within the circuit goes high, transistor 17 will conduct pulling node 13 low, transistor 22 will conduct pulling node 14 high, transistor 24 will conduct placing a low level at the gate electrodes of transistors 21 and 23 and rendering them non-conductive, and transistor 31 will conduct to discharge the gate electrode of transistor 30. All this action insures that output node 14 will be allowed to go to a high level without interruption.

Figure 2:
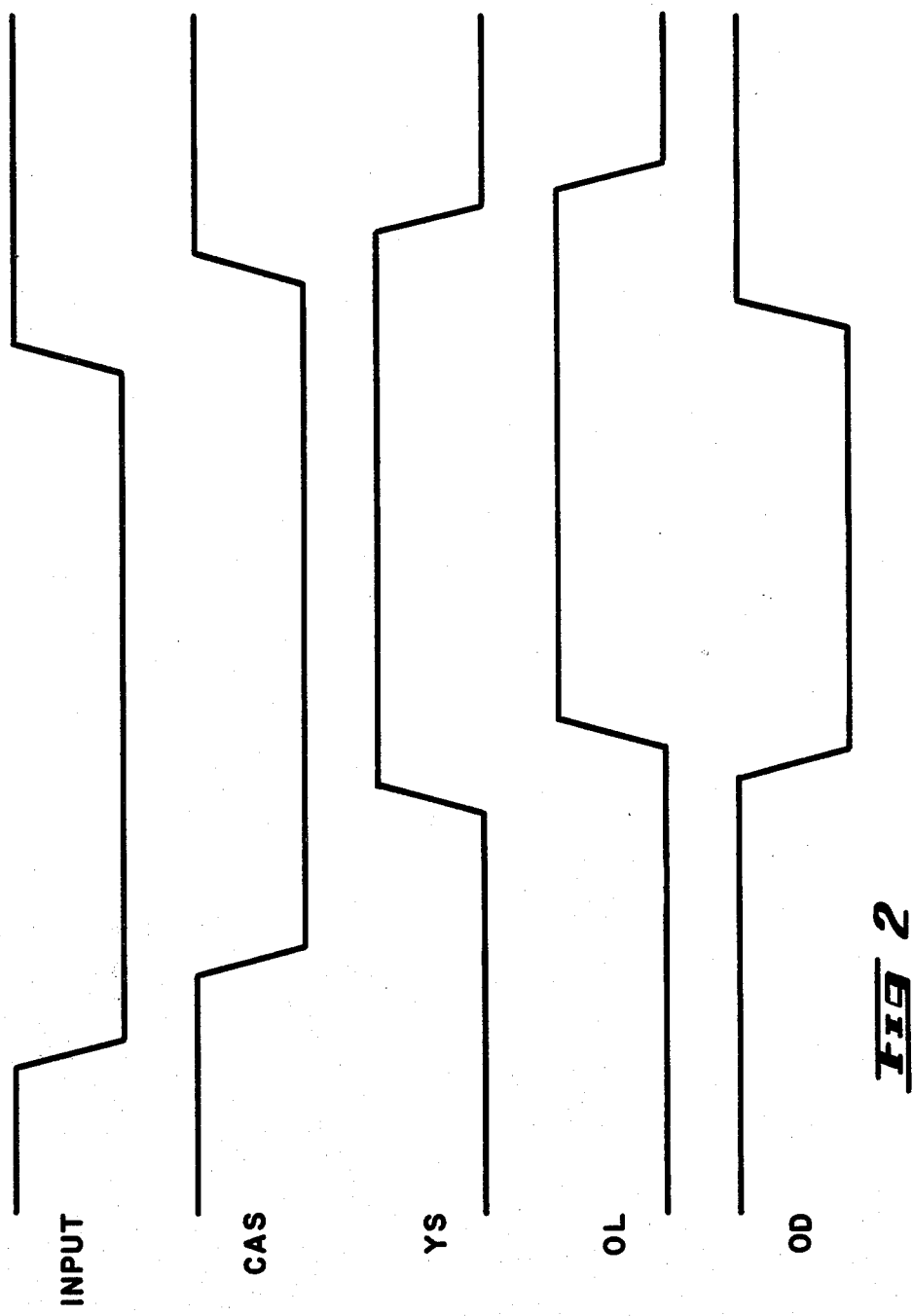
FIG. 2 shows some timing waveforms which may be helpful in better understanding the operation of the circuitry of FIG. 1.

FIG. 2 illustrates some waveforms which are useful in understanding the operation of the circuitry of FIG. 1. As illustrated, the INPUT signal leads timing signal CAS. When the INPUT signal and signal CAS are at a high level, signal YS and OL are at a low level, which then go high when the INPUT and CAS signals go low. Note that the output latch signal OL trails signal YS by a short period of time. The bottom signal is output disable signal OD and note that it goes high at almost the same time that the INPUT signal goes high. The INPUT signal is shown by the top waveform.

We claim:

1. A signal generating circuit to generate an output signal in response to an input signal and having a first and a second voltage terminal wherein the second terminal can serve as a reference for the first terminal, comprising: a first inverter for receiving the input signal; a cross coupled latch coupled to the first inverter and having an output for providing the output signal; a pull-up means coupled to the output to pull-up the output; a controllable load device coupled to an input of the cross coupled latch; a controllable discharging means for discharging the output upon command; and a control means for controlling the controllable load device and the controllable discharging means.

2. The generating circuit of claim 1 further including overriding means coupled to the output to drive the output to a predetermined level and coupled to the control means for inhibiting the control means.

3. The generating circuit of claim 2 wherein the cross coupled latch has an input, and the overriding means includes a field effect transistor coupled between the first voltage terminal and the output of the cross coupled latch, and further has a field effect transistor coupled between the second voltage terminal and the input of the cross coupled latch.

4. The generating circuit of claim 1 wherein the pull-up means comprises a first transistor having a first, a second, and a control electrode, the first electrode being coupled to the first voltage terminal, and the second electrode being coupled to the output; a second transistor having a first, a second and a control electrode, the first and second electrodes of the second transistor being coupled to the second electrode of the first transistor, and the gate electrode of the second transistor being coupled to the gate electrode of the first transistor; and a third transistor having a first, a second, and a gate electrode, the gate electrode and the first electrode of the third transistor being coupled to the first voltage terminal, and the second electrode of the third transistor being coupled to the gate electrode of the first transistor.

5. A circuit for generating an output disable signal useful for disabling an output driver of a memory so that data from the memory can be outputted, the circuit generates the output disable signal from an input signal and also has a first and a second voltage terminal, comprising: an inverter having an input and an output, the input being for receiving the input signal; a latch for latching the input signal, the latch having an input coupled to the output of the inverter, the latching having an output providing the output disable signal; a first transistor coupled between the output of the latch and the second voltage terminal and having a gate electrode; and a controllable means coupled to the gate electrode of the first transistor to enable the first transistor thereby placing the output of the latch at a low level, and wherein the latch includes a second transistor coupled between the input of the latch and the second voltage terminal and having a gate electrode coupled to the output of the latch; and a third transistor coupled between the output of the latch and the second voltage terminal and having a gate electrode coupled to the input of the latch; and a fourth transistor being coupled between the first voltage terminal and the input of the latch and having a gate electrode coupled to the gate electrode of the first transistor.

6. The circuit of claim 5 further including pull-up means for pulling the output of the latch up to a high level.

7. The circuit of claim 6 wherein the pull-up means includes a fifth transistor coupled between the first voltage terminal and the output of the latch and having a gate electrode, a sixth transistor having a first and a second electrode coupled to the output of the latch and having a gate electrode coupled to the gate electrode of the fifth transistor, and a seventh transistor coupled between the first voltage terminal and the gate electrode of the fifth transistor and having a gate electrode coupled to the first voltage terminal.

8. The circuit of claim 5 wherein the controllable means comprises an eighth transistor coupled between the gate electrode of the first transistor and a first timing signal input terminal, the eighth transistor having a gate electrode; a ninth transistor coupled between the first voltage terminal and the gate electrode of the eighth transistor and having a gate electrode for receiving a second timing signal; a tenth transistor coupled between the gate electrode of the eighth transistor and the second voltage terminal and having a gate electrode for receiving a third timing signal; an eleventh transistor coupled between the gate electrode of the first transistor and the second voltage terminal and having a gate electrode; a twelfth transistor coupled between the first voltage terminal and the gate electrode of the eleventh transistor and having a gate electrode for receiving the third timing signal; and a thirteenth transistor coupled between the gate electrode of the eleventh transistor and the second voltage terminal and having a gate electrode for receiving the second timing signal.

9. The circuit of claim 5 further including a fourteenth transistor coupled between the input of the latch and the second voltage terminal and having a gate electrode for receiving an overriding signal; a fifteenth transistor coupled between the output of the latch and the first voltage terminal and having a gate electrode for receiving the overriding signal; a sixteenth transistor coupled between the gate electrode of the first transistor and the second voltage terminal and having a gate electrode for receiving the overriding signal; and a seventeenth transistor coupled between the gate electrode of the eighth transistor and the second voltage terminal and having a gate electrode for receiving the overriding signal.

* * * * *